United States Patent
Jefferies et al.

(10) Patent No.: US 11,333,690 B2
(45) Date of Patent: May 17, 2022

(54) CURRENT MEASUREMENT COMPENSATION FOR HARMONICS

(71) Applicant: Schneider Electric USA, Inc., Andover, MA (US)

(72) Inventors: Kevin M. Jefferies, Raleigh, NC (US); Benjamin W. Edwards, Rolesville, NC (US); Richard K. Weiler, Wake Forest, NC (US); Alan E. Freeman, Raleigh, NC (US)

(73) Assignee: Schneider Electric USA, Inc., Boston, MA (US)

( * ) Notice: Subject to any disclaimer, the term of this patent is extended or adjusted under 35 U.S.C. 154(b) by 174 days.

(21) Appl. No.: 16/715,573

(22) Filed: Dec. 16, 2019

(65) Prior Publication Data
US 2021/0181243 A1 Jun. 17, 2021

(51) Int. Cl.
*G01R 19/25* (2006.01)

(52) U.S. Cl.
CPC ................ *G01R 19/2506* (2013.01)

(58) Field of Classification Search
CPC .... G01R 19/2506; G01R 19/25; G01R 19/00; G01R 23/20; G01R 19/0007; G01R 19/2509; G01R 19/0092
See application file for complete search history.

(56) References Cited

U.S. PATENT DOCUMENTS

| 6,041,287 A * | 3/2000 | Dister ................... B60L 3/0023 |
| | | 702/182 |
| 2010/0159856 A1* | 6/2010 | Kato ....................... H03F 3/245 |
| | | 455/114.3 |
| 2012/0084035 A1 | 4/2012 | Carter et al. |

(Continued)

FOREIGN PATENT DOCUMENTS

WO  WO2010037413 A1  4/2010

OTHER PUBLICATIONS

Extended European Search Report dated May 5, 2021 for corresponding European Application No. EP20212370.9-1010, 7 pages.

(Continued)

*Primary Examiner* — Mohamed Charioui
(74) *Attorney, Agent, or Firm* — Locke Lord LLP

(57) ABSTRACT

A measurement module uses harmonic compensation factors to minimize the effects of harmonic distortion in measurements of a source current by a current sensor of the module. The module samples at a first sampling rate, measurements of the source current to generate a first current measurement. The module samples at a second sampling rate higher than the first sampling rate, for an interval of time, measurements of the source current to generate a second current measurement. The module determines a harmonic compensation factor based, at least, on a difference between the first current measurement and the second current measurement. The module determines a reported current computed as a function of at least the first current measurement, the difference between the first current measurement and the second current measurement, and the harmonic compensation factor. The reported current represents a magnitude of the source current adjusted by the harmonic compensation factor.

19 Claims, 6 Drawing Sheets

(56) References Cited

U.S. PATENT DOCUMENTS

| | | | |
|---|---|---|---|
| 2014/0285120 A1 | 9/2014 | Gries et al. | |
| 2015/0123675 A1* | 5/2015 | Martini | G01R 31/72 |
| | | | 324/546 |
| 2016/0191020 A1* | 6/2016 | Velazquez | H03H 21/0067 |
| | | | 341/118 |
| 2016/0276969 A1* | 9/2016 | Krefta | H02P 29/032 |

OTHER PUBLICATIONS

Harmonic Mitigation Solution Handbook; Schneider Electric SA, Jun. 2009.

* cited by examiner

FIG. 3 LOGIC BLOCKS OF THE COMPONENT 116 IN THE MEASUREMENT MODULE 300

302 — BLOCK 302: SAMPLING AT A FIRST SAMPLING RATE, MEASUREMENTS OF A SOURCE CURRENT USING A CURRENT SENSOR OF A MEASUREMENT MODULE TO GENERATE A FIRST CURRENT MEASUREMENT;

304 — BLOCK 304: SAMPLING AT A SECOND SAMPLING RATE HIGHER THAN THE FIRST SAMPLING RATE, FOR AN INTERVAL OF TIME, MEASUREMENTS OF THE SOURCE CURRENT USING THE CURRENT SENSOR OF THE MEASUREMENT MODULE TO GENERATE A SECOND CURRENT MEASUREMENT;

306 — BLOCK 306: DETERMINING A HARMONIC COMPENSATION FACTOR BASED, AT LEAST, ON A DIFFERENCE BETWEEN THE FIRST CURRENT MEASUREMENT AND THE SECOND CURRENT MEASUREMENT; AND

308 — BLOCK 308: DETERMINING A REPORTED CURRENT THAT IS COMPUTED AS A FUNCTION OF AT LEAST (I) THE FIRST CURRENT MEASUREMENT BY THE CURRENT SENSOR, (II) THE DIFFERENCE BETWEEN THE FIRST CURRENT MEASUREMENT AND THE SECOND CURRENT MEASUREMENT BY THE CURRENT SENSOR, AND (III) THE HARMONIC COMPENSATION FACTOR, THE REPORTED CURRENT REPRESENTING A MAGNITUDE OF THE SOURCE CURRENT ADJUSTED BY THE HARMONIC COMPENSATION FACTOR.

CURRENT MEASUREMENT COMPENSATION FOR HARMONICS

TECHNICAL FIELD

The present disclosure relates to minimizing harmonic distortion, and more particularly, to minimizing the effects of harmonic distortion in measurements from current sensors.

BACKGROUND

In typical power systems, the source current is an alternating current that usually has a frequency of 60 Hz as its fundamental frequency. At the site of its generation at a power station, the source current and its voltage have a sinusoidal waveform. When powering loads such as incandescent lights or resistive heating elements, the source current has the same sinusoidal waveform as the supply voltage, although their phases may be different. Such loads are referred to as linear loads. When powering loads such as welding machines, arc furnaces, or rectifiers, the source current deviates from the sinusoidal waveform. Such loads are referred to as non-linear loads. When the non-linear load is connected to the power system, it draws a current that is not necessarily sinusoidal, but continues to be periodic at the fundamental frequency, such as 60 Hz. The current waveform becomes distorted by the addition of harmonic sinusoidal waveform components to the fundamental sinusoidal waveform. Each harmonic sinusoidal component waveform has a frequency that is an integral multiple of the fundamental frequency.

Harmonic distortion in the source current may cause problems in other electrical devices powered by the system. The distorted signal has a higher root-mean-squared (RMS) current value than the fundamental current. Apparent power is the product of the RMS value of the current and the RMS value of the voltage, so that harmonic distortion in the source current will cause increased power dissipation in other connected devices. Typically, the problem of harmonic distortion in source currents in a power system has been addressed by the selection of devices in the system to be oversized, which increases the cost of the equipment.

What is needed is a way to accurately measure source currents that have harmonic distortion, so that appropriate changes can be made to the location of non-linear loads in the power system network. Existing techniques for measuring source currents result in false readings due to the harmonic distortion.

SUMMARY

In accordance with one embodiment described herein, a measurement module uses harmonic compensation factors to minimize the effects of harmonic distortion in measurements of a source current by a current sensor of the module. The module samples at a first sampling rate, measurements of the source current to generate a first current measurement. The module samples at a second sampling rate higher than the first sampling rate, for an interval of time, measurements of the source current to generate a second current measurement. The module determines a harmonic compensation factor based, at least, on a difference between the first current measurement and the second current measurement. The module applies the determined harmonic compensation factor to a third current measurement collected by the current sensor of the measurement module.

In accordance with one embodiment described herein, a method, comprises sampling at a first sampling rate, measurements of a source current using a current sensor of a measurement module to generate a first current measurement. The method continues with sampling at a second sampling rate higher than the first sampling rate, for an interval of time, measurements of the source current using the current sensor of the measurement module to generate a second current measurement. The method continues with determining a harmonic compensation factor based, at least, on a difference between the first current measurement and the second current measurement. Then the method continues with applying the determined harmonic compensation factor to a third current measurement collected by the current sensor of the measurement module.

In accordance with an embodiment described herein, the method further comprises updating the second sampling of the measurements of the source current at a higher sampling rate than the first sampling rate during repeated intervals of time, to generate updated second current measurements. The method continues with determining an updated harmonic compensation factor based on a difference between the first current measurement and the updated second current measurement. Then the method continues with updating a reported current in response to the updated second current measurement and the updated harmonic compensation factor during the repeated intervals of time, the updated reported current representing a magnitude of the source current adjusted by the updated harmonic compensation factor.

In accordance with an embodiment described herein, a method, comprises controlling a measurement module to use a first sampling frequency to sample a source current to generate a first current measurement. The method continues with controlling the measurement module to use a second sampling frequency to sample the source current to temporarily increase a sampling frequency of the source current for an interval of time to generate a second current measurement. The method continues with providing a harmonic compensation factor to the measurement module to minimize effects of harmonic distortion in measurements of the source current. The method continues with receiving a reported current from the measurement module representing a magnitude of the source current adjusted by a sum of the first current measurement and a difference between the first current measurement and the second current measurement, with the harmonic compensation factor applied to the sum. The method continues with comparing a magnitude of the received reported current with magnitudes of previously received reported currents measured at lower sampling rates to determine whether an increase in the magnitude of the received reported current over the magnitudes of previously received reported currents is minimal, indicating an accuracy in the measurement of the source current. The method continues with adjusting at least one of the second sampling frequency or the harmonic compensation factor in response to the comparing magnitude of the received reported current with the magnitudes of previously received reported currents. Then the method continues with controlling the measurement module to repeat sampling the source current using at least one of the adjusted second sampling frequency or the adjusted harmonic compensation factor.

The resulting method, apparatus, system, and computer program product minimize the effects of harmonic distortion in measurements from current sensors.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIG. 3 is an example flow diagram of a method performed by the example measurement module of FIG. 1, according to an embodiment of the disclosure.

Identical reference numerals have been used, where possible, to designate identical elements that are common to the figures. However, elements disclosed in one embodiment may be beneficially utilized on other embodiments without specific recitation.

DETAILED DESCRIPTION

Figure 1:
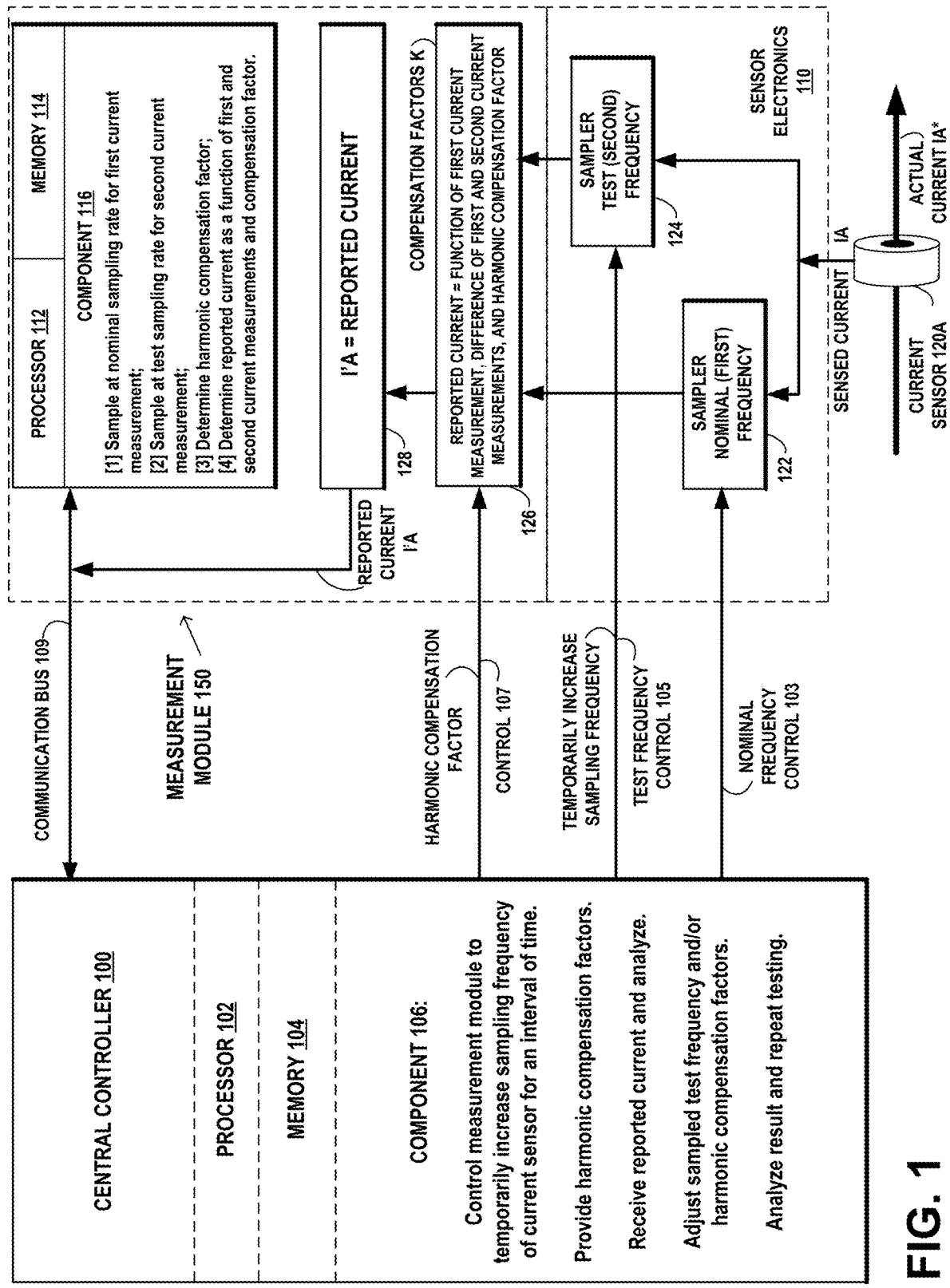
FIG. 1 is an example functional block diagram of a central controller and a measurement module that uses harmonic compensation factors to minimize the effects of harmonic distortion in measurements of a source current waveform by a current sensor of the module, according to an embodiment of the disclosure.

FIG. 1 is an example functional block diagram of a central controller 100 and a measurement module 150 that uses harmonic compensation factors to minimize the effects of harmonic distortion in measurements of a source current waveform IA* by a current sensor 120A of the module, according to an embodiment of the disclosure. The example central controller 100 includes at least one processor 102 and at least one memory 104 that includes computer program code that, when executed by operation of the processor 102, performs operations of logic blocks in the component 106. The example measurement module 150 includes at least one processor 112 and at least one memory 114 that includes computer program code that, when executed by operation of the processor 112, performs operations of logic blocks in the component 116.

Figure 2A:
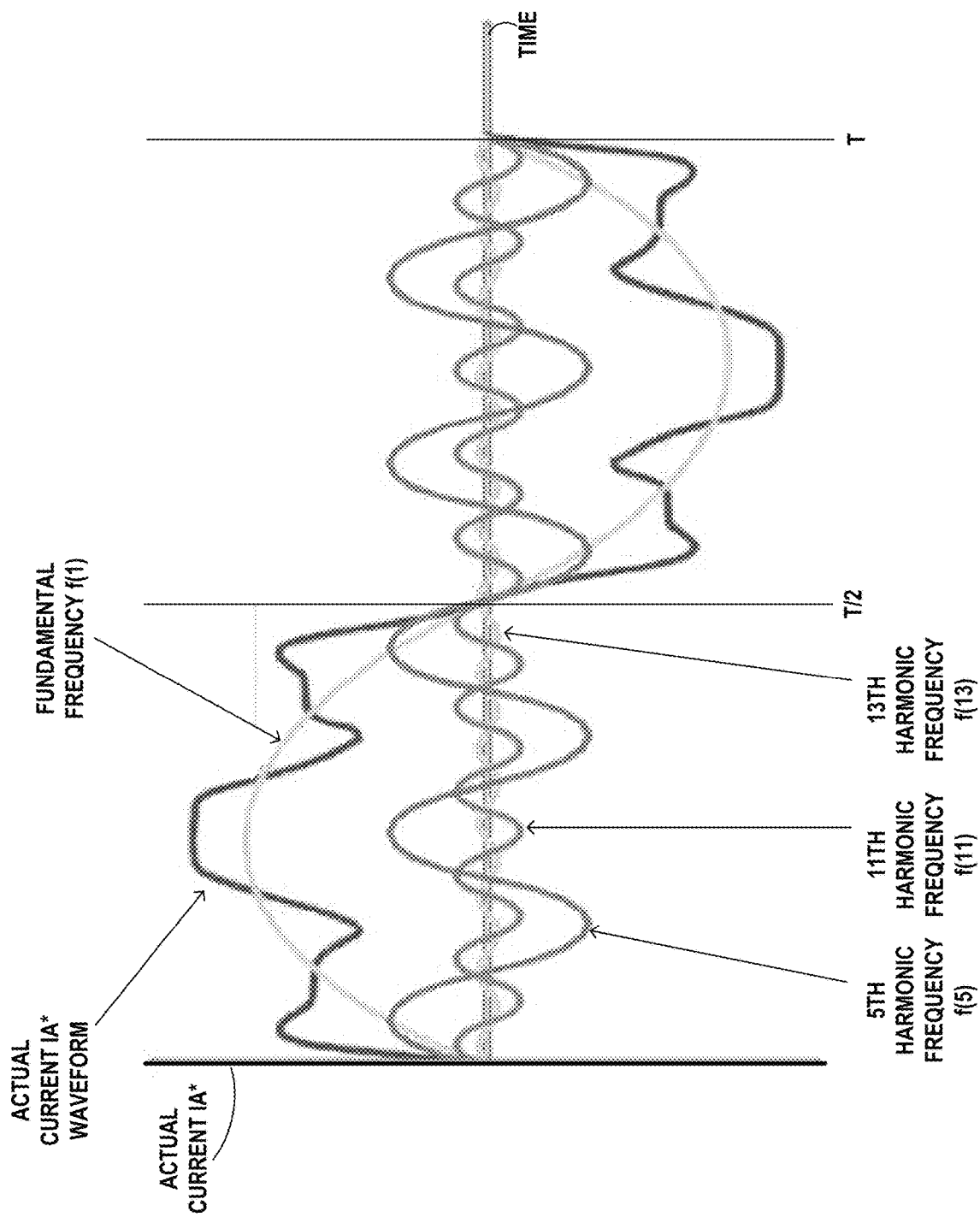
FIG. 2A shows the example source current waveform measured by the current sensor of the module, and its fundamental frequency sinusoidal waveform that is distorted by three harmonic frequency sinusoidal waveforms, which are components of the example source current waveform, according to an embodiment of the disclosure.

The example current sensor 120A is a current transformer arranged directly around a conductor of the source current IA*, which outputs a secondary current IA, whose magnitude is measured and is approximately proportional to the magnitude of the source current IA*. FIG. 2A shows the source current IA* waveform over one period T. An example fundamental frequency waveform f(1) at 60 Hz of the source current IA* shown in FIG. 2A, is distorted by the addition of harmonic sinusoidal waveform components, for example by: the fifth harmonic f(5) at 300 Hz, the eleventh harmonic f(11) at 660 Hz, and the thirteenth harmonic f(13) at 780 Hz. Each example harmonic sinusoidal component waveform f(5), f(11), and f(13) has a frequency that is an integral multiple of the fundamental frequency f(1) of 60 Hz. The harmonic distortion of the fundamental frequency waveform f(1) may be due to the connection of a non-linear load to the power system.

Figure 2B:
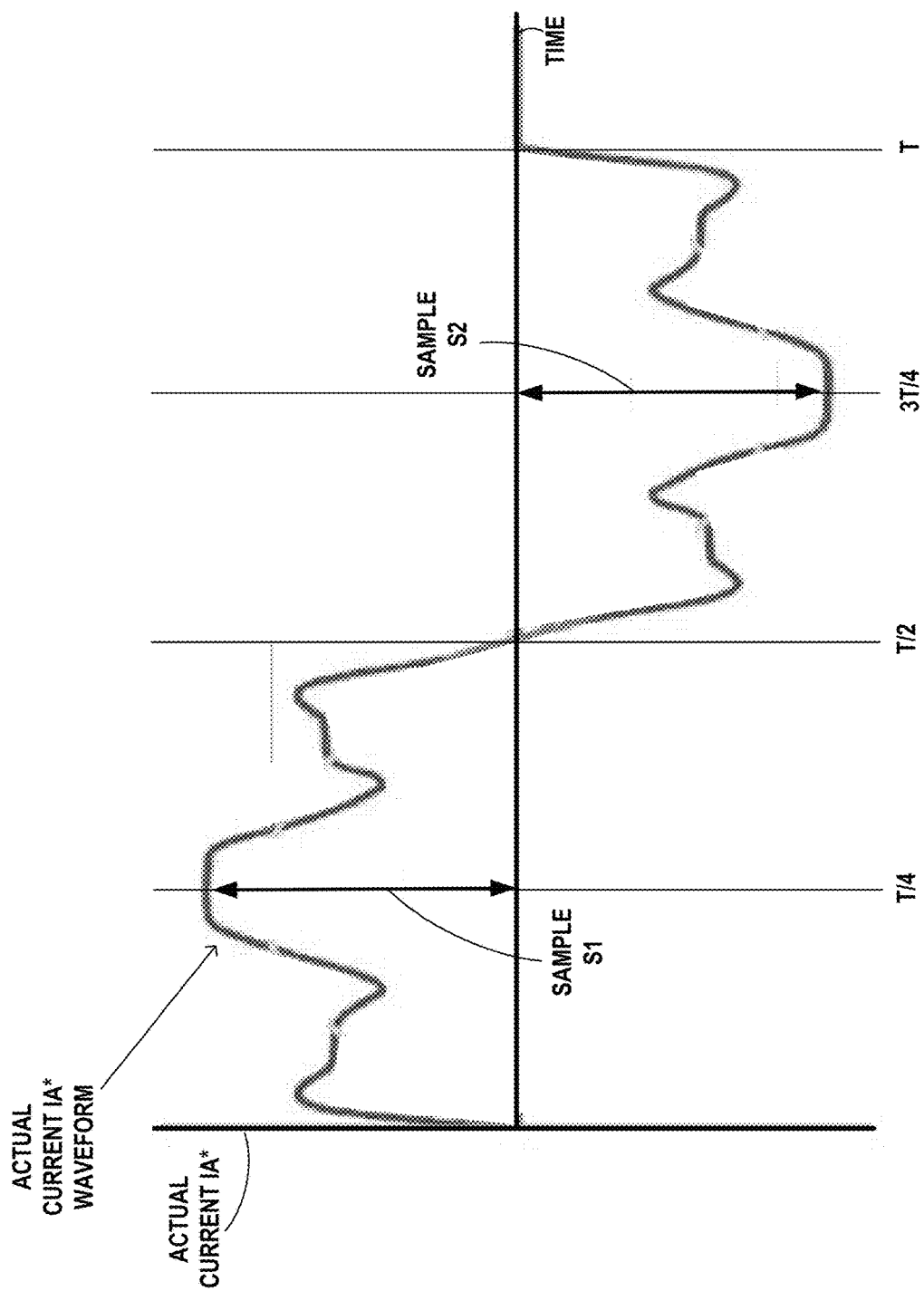
FIG. 2B shows the example source current waveform measured by the current sensor of the module, sampled at a first sampling rate to generate a first current measurement, according to an embodiment of the disclosure.

The example logic blocks in the component 106 of the central controller 100 control the measurement module 150 over line 103 to use a nominal sampling frequency to sample the secondary current IA output by the of the current sensor 120A. The logic blocks in the component 116 of the measurement module 150 use the nominal sampling frequency to sample the secondary current IA output by the of the current sensor 120A. For example, FIG. 2B shows the example source current waveform IA* measured by the current sensor 120A, sampled by the sampler 122 in FIG. 1 at a first sampling rate of 120 Hz to generate a first current measurement. Sample 1 is taken at time T/4 and sample 2 is taken at time 3T/4 of the period T. Although the distorted waveform of the source current IA* actually has a higher root-mean-squared (RMS) current value than the RMS current of the fundamental waveform f(1), the RMS value of the current sampled at T/4 and 3T/4 of the period T is incorrectly measured as being less than the actual value for the distorted waveform.

Figure 2C:
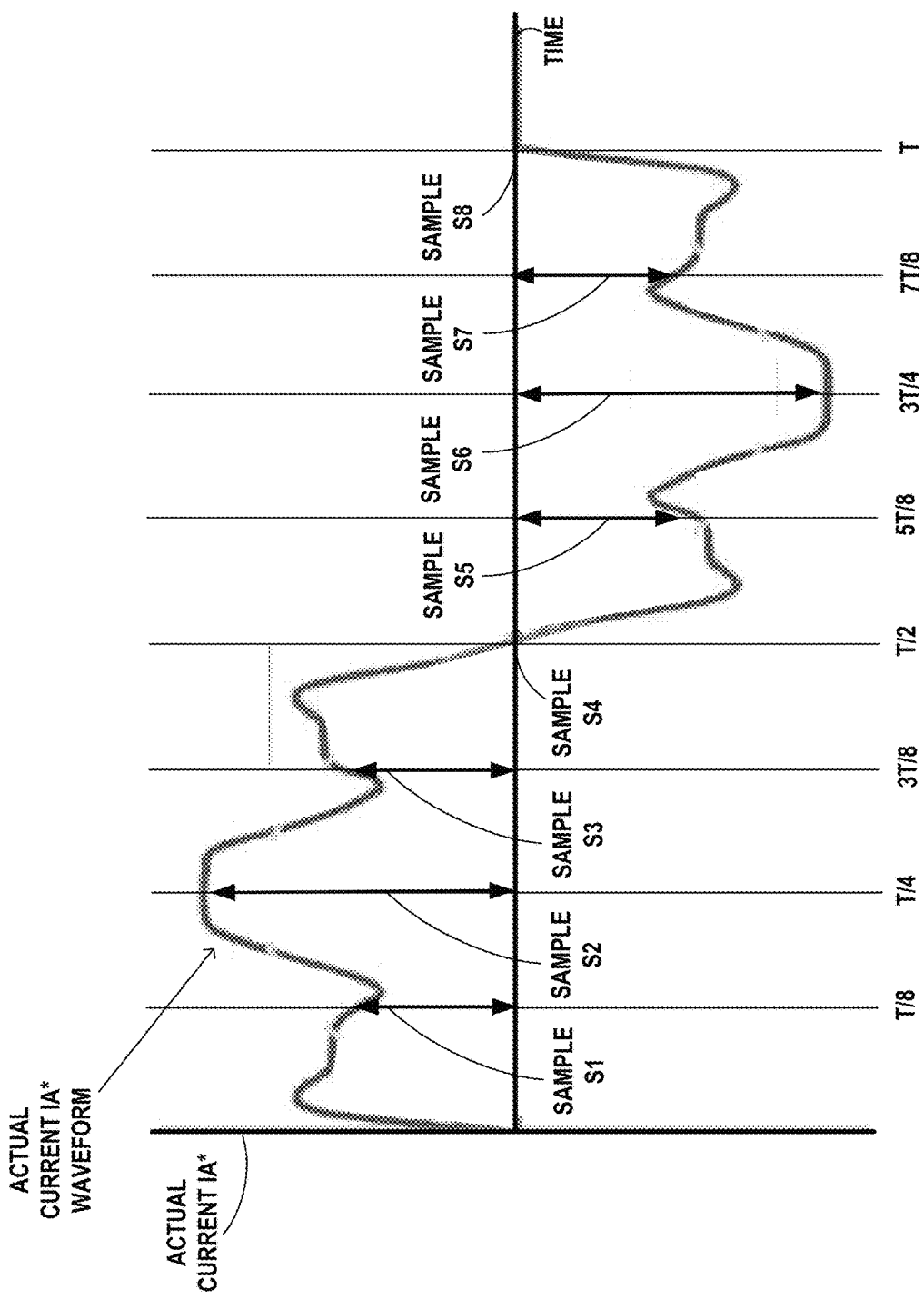
FIG. 2C shows the example source current waveform measured by the current sensor of the module, sampled at a second sampling rate that is higher than the first sampling rate, for an interval of time, to generate a second current measurement, according to an embodiment of the disclosure.

To guard against making incorrect measurements of the source current IA* in the event there happens to be harmonic distortion of the source current, the example logic blocks in the component 106 of the central controller 100 control the measurement module 150 over line 105 to use a test or second sampling frequency to sample the secondary current IA output by the of the current sensor 120A. This is done to temporarily increase the sampling frequency of the secondary current IA output by the current sensor 120A for an interval of time. The example logic blocks in the component 116 of the measurement module 150 use the second sampling rate to generate a second current measurement. For example, FIG. 2C shows the example source current waveform IA* measured by the current sensor 120A, sampled by the sampler 124 in FIG. 1 at a second, higher sampling rate of 480 Hz to generate a second current measurement. Sample 1 is taken at time T/8, sample 2 is taken at time T/4, . . . and sample 8 is taken at time T of the period T. By taking more samples the distorted waveform of the source current IA* at the higher sampling frequency, a greater and more accurate RMS current value is measured than was previously measured by taking only two samples, as shown in FIG. 2B.

In an example embodiment, the example logic blocks in the component 106 of the central controller 100 provide harmonic compensation factors over line 107 to the measurement module 150, to minimize the effects of harmonic distortion in measurements of the source current IA* by the current sensor 120A. An initial value of the harmonic compensation factor may be unity, for example, so that the magnitude of the initial difference between the first current measurement and the second current measurement can be analyzed by the central controller 100. In another example embodiment, the example logic blocks in the component 116 of the measurement module 150 may determine an updated harmonic compensation factor based on a difference between the first current measurement and the updated second current measurement.

The example logic blocks in the component 116 of the measurement module 150 cause the register 126 to add to the first current measurement by the current sensor to the difference between the first current measurement and the second current measurement by the current sensor. The sum is then multiplied by the harmonic compensation factor to obtain the resulting estimated actual magnitude of the source current IA*, referred to here as the reported current I'A, representing a magnitude of the source current IA* adjusted by the harmonic compensation factor. The reported current I'A is output by the example register 128 on the communication bus 109 to the central controller 100.

The logic blocks in the component 106 of the central controller 100 receive the reported current I'A. The example logic blocks in the component 106 may compare the reported current I'A with expected values of the source current IA*, comparing a magnitude of the received reported current I'A with magnitudes of previously received reported currents measured at lower sampling rates to determine whether an increase in the magnitude of the received reported current I'A over the magnitudes of previously received reported currents is minimal, indicating achieving a level of accuracy in the measurement of the source current IA*. The example logic blocks in the component 106 may correlate the reported current I'A with the distorting effects caused by recent connections of non-linear loads to the power system.

To improve the accuracy in measuring the source current IA*, the example logic blocks in the component 106 of the central controller 100 may adjust sampled test frequency and/or the harmonic compensation factors and send signals over control lines 103 and 105 to the measurement module 150 to repeat testing. The adjusting may be in response to comparing magnitude of the received reported current I'A with the magnitudes of previously received reported currents. The example logic blocks in the component 106 of the central controller 100 may control the measurement module 150 to repeat sampling the source current IA* using at least one of the adjusted second sampling frequency or the adjusted harmonic compensation factor.

The example logic blocks in the component 116 of the measurement module 150 may cause updating of the second sampling of the measurements of the source current IA* at a higher sampling rate than the first sampling rate during repeated intervals of time, to generate updated second current measurements. The example logic blocks in the component 116 of the measurement module 150 may determine an updated harmonic compensation factor based on a difference between the first current measurement and the updated second current measurement. The example logic blocks in the component 116 of the measurement module 150 may update the reported current I'A in response to the updated second current measurement and the updated harmonic compensation factor during the repeated intervals of time. The updated reported current I'A represents a magnitude of the source current I*A adjusted by the updated harmonic compensation factor. The updated reported current I'A is output by the register 128 on the communication bus 109 to the central controller 100.

FIG. 3 is an example flow diagram 300 of a method performed by the component 116 of the example measurement module 150 of FIG. 1, according to an embodiment of the disclosure. The logic blocks of the flow diagram may be implemented by computer program instructions stored in the memory 114 and executed by the processor 112 in the measurement module 150 of FIG. 1. Alternately, the logic blocks of the flow diagram may also be implemented by computer hardware logic in the measurement module 150 of FIG. 1, which can carry out the functions specified by the logic blocks.

The method performed by the example measurement module 150 for minimizing the effects of harmonic distortion, comprises the following logic blocks:

Block 302: sampling at a first sampling rate, measurements of a source current using a current sensor of a measurement module to generate a first current measurement;

Block 304: sampling at a second sampling rate higher than the first sampling rate, for an interval of time, measurements of the source current using the current sensor of the measurement module to generate a second current measurement;

Block 306: determining a harmonic compensation factor based, at least, on a difference between the first current measurement and the second current measurement; and Block 308: determining a reported current that is computed as a function of at least (i) the first current measurement by the current sensor, (ii) the difference between the first current measurement and the second current measurement by the current sensor, and (iii) the harmonic compensation factor, the reported current representing a magnitude of the source current adjusted by the harmonic compensation factor.

In an example embodiment, the example logic blocks in the component 116 of the measurement module 150 may increment the second sampling rate through a plurality of different second sampling rates, each higher than the first sampling rate, to generate a plurality of second current measurements. The example logic blocks in the component 116 of the measurement module 150 may select one of the plurality of different second sampling rates corresponding to a maximum difference between the first current measurement and the plurality of second current measurements. The example logic blocks in the component 116 of the measurement module 150 may sample at the selected one of the plurality of different second sampling rates, measurements of the source current using the current sensor of the measurement module to generate a characterizing second current measurement. The example logic blocks in the component 116 of the measurement module 150 may determine a harmonic compensation factor based on a difference between the first current measurement and the characterizing second current measurement.

In an example embodiment, the example logic blocks in the component 116 of the measurement module 150 may update the second sampling of the measurements of the source current at a higher sampling rate than the first sampling rate during an updated interval of time, to generate updated second current measurements. The example logic blocks in the component 116 of the measurement module 150 may determine an updated harmonic compensation factor based on a difference between the first current measurement and the updated second current measurement. The example logic blocks in the component 116 of the measurement module 150 may update the reported current in response to the updated second current measurement and the updated harmonic compensation factor during the updated interval of time, the updated reported current representing a magnitude of the source current adjusted by the updated harmonic compensation factor.

In an example embodiment, the example logic blocks in the component 116 of the measurement module 150 may transmit to the central controller 100, at least the difference between the first current measurement and the second current measurement by the current sensor. The example logic blocks in the component 116 of the measurement module 150 may receive from the central controller 100, in response, the harmonic compensation factor based on the difference between the first current measurement and the second current measurement. The example logic blocks in the component 116 of the measurement module 150 may transmit to the central controller 100 the reported current.

In an example embodiment, some applications may have multiple devices in series with each other. In such cases, intensive processing of calculations for thermal modelling and multiplying by voltage to get power and energy, may be done by only one of the devices, since the second device is redundant. In accordance with the example embodiment, the less busy second device may be employed to sample current faster. For example, allow the first device doing the more computationally intensive operations to measure at a lower frequency, such as 20 Hz. For the second device that is less busy, control it to measure at a higher sampling rate of, for example, 780 Hz. The sampled information by the second device at the higher frequency may be used to provide the first device with a compensation factor. In this manner, the first device may be provided with more accurate current information including harmonics, without having to sample any more quickly.

Figure 4:
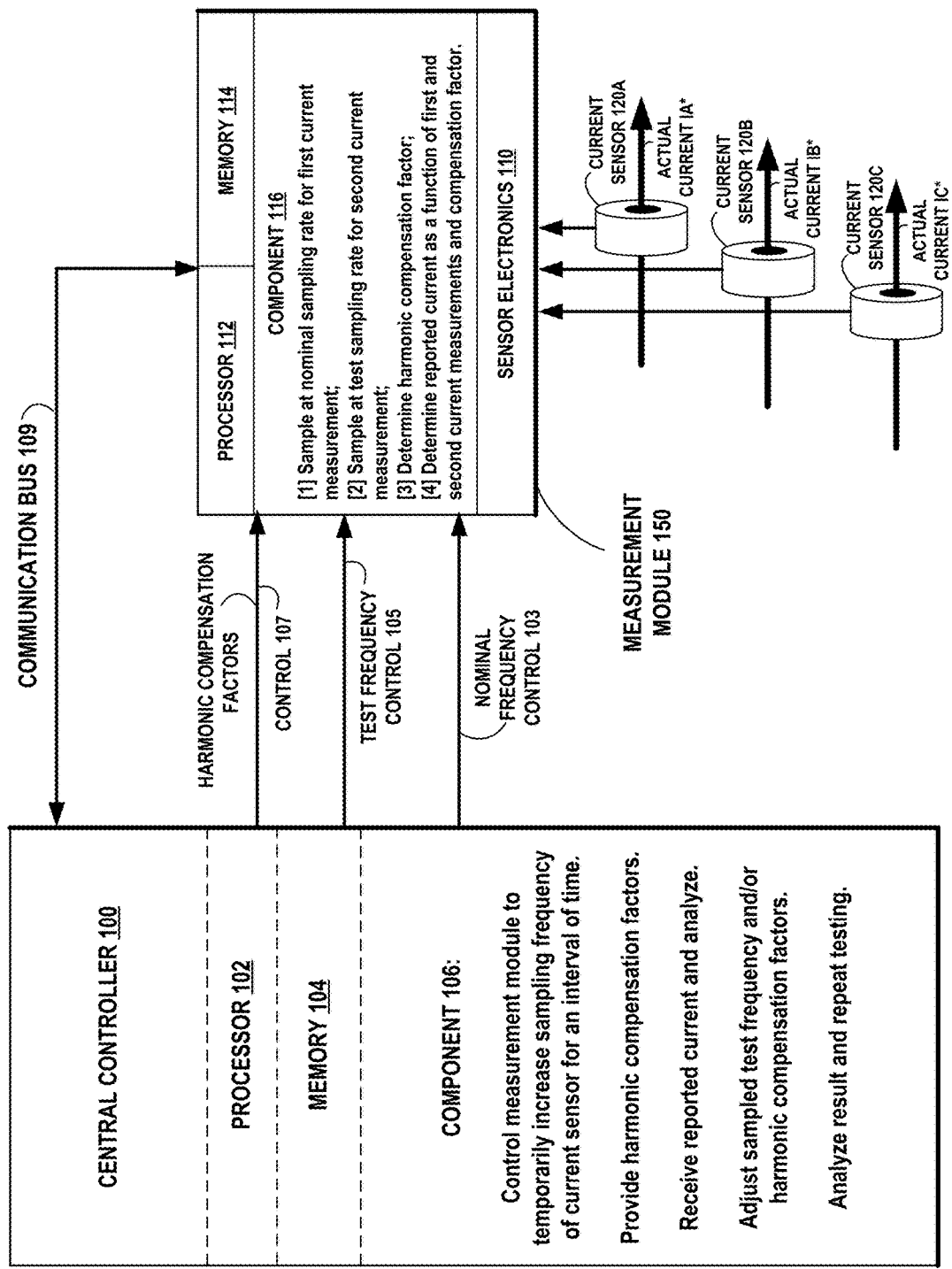
FIG. 4 is an example functional block diagram of the central controller and the measurement module of FIG. 1 with three current sensors for measuring three poly-phase source currents, according to an embodiment of the disclosure.

FIG. 4 is an example functional block diagram of the central controller 100 and the measurement module 150 of FIG. 1, with three current sensors 120A, 120B, and 120C measuring three poly-phase source currents IA*, IB*, and IC*. In an example embodiment, the example logic blocks in the component 116 of the measurement module 150 may attribute the harmonic compensation factor based on the difference between the first current measurement and the second current measurement of the source current IA*, to the other source currents IB* and IC* that are members of the same group of poly-phase currents. In this embodiment, the higher sampling rate is done on only source current IA* and applied to the others, under the assumption that the harmonic distortion is of equivalent magnitude among all three phases of a poly-phase system.

In another example embodiment, the example functional block diagram of FIG. 4 may employ the concept of rotating through phases. The high sampling rate may first be applied to phase A, then to phase B, and then to phase C. This embodiment may be used to determine if the harmonic distortion is indeed of equivalent magnitude among all three phases, or if different compensation factors are needed for each phase.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "component", "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. A measurement module for minimizing harmonic distortion, comprising:
   at least one processor;
   at least one memory including computer program code, wherein the computer program code, when executed by operation of the at least one processor, performs an operation comprising:
   sampling, at a first sampling rate, a first current measurement of a source current using a current sensor of the measurement module;
   incrementing a second sampling rate through a plurality of different second sampling rates, each higher than the first sampling rate, to generate a plurality of second current measurements;
   selecting one of the plurality of different second sampling rates corresponding to a maximum difference between the first current measurement and the plurality of second current measurements;
   sampling at the selected one of the plurality of different second sampling rates, measurements of the source current using the current sensor of the measurement module to generate a characterizing second current measurement;
   determining a harmonic compensation factor based on a difference between the first current measurement and the characterizing second current measurement; and
   applying the determined harmonic compensation factor to a third current measurement collected by the current sensor of the measurement module.

2. The measurement module of claim 1, the operation further comprising:
   updating the second sampling of the measurements of the source current at a higher sampling rate than the first sampling rate during repeated intervals of time, to generate updated second current measurements;
   determining an updated harmonic compensation factor based on a difference between the first current measurement and the updated second current measurement; and
   updating a reported current in response to the updated second current measurement and the updated harmonic compensation factor during the repeated intervals of time, the updated reported current representing a magnitude of the source current adjusted by the updated harmonic compensation factor.

3. The measurement module of claim 1, wherein:
   the source current is one member of a group of poly-phase currents; and the operation further comprising:
   attributing the harmonic compensation factor based on the difference between the first current measurement and the second current measurement, to other currents that are members of the group of poly-phase currents.

4. The measurement module of claim 1, the operation further comprising:
   updating the second sampling of the measurements of the source current at a higher sampling rate than the first sampling rate during an updated interval of time, to generate updated second current measurements;
   determining an updated harmonic compensation factor based on a difference between the first current measurement and the updated second current measurement; and
   updating a reported current in response to the updated second current measurement and the updated harmonic compensation factor during the updated interval of time, the updated reported current representing a magnitude of the source current adjusted by the updated harmonic compensation factor.

5. The measurement module of claim 1, the operation further comprising:
   transmitting to a central controller, at least the difference between the first current measurement and the second current measurement by the current sensor;
   receiving from the central controller, in response, the harmonic compensation factor based on the difference between the first current measurement and the second current measurement; and
   transmitting to the central controller a reported current.

6. The measurement module of claim 1, further comprising:
   determining a reported current that is computed as a function of at least (i) the first current measurement by the current sensor, (ii) the difference between the first current measurement and the second current measurement by the current sensor, and (iii) the harmonic compensation factor, the reported current representing a magnitude of the source current adjusted by the harmonic compensation factor.

7. A method for minimizing harmonic distortion, comprising:
   sampling, at a first sampling rate, a first current measurement of a source current using a current sensor of the measurement module;
   incrementing a second sampling rate through a plurality of different second sampling rates, each higher than the first sampling rate, to generate a plurality of second current measurements;
   selecting one of the plurality of different second sampling rates corresponding to a maximum difference between the first current measurement and the plurality of second current measurements;
   sampling at the selected one of the plurality of different second sampling rates, measurements of the source current using the current sensor of the measurement module to generate a characterizing second current measurement;
   determining a harmonic compensation factor based on a difference between the first current measurement and the characterizing second current measurement; and
   applying the determined harmonic compensation factor to a third current measurement collected by the current sensor of the measurement module.

8. The method of claim 7, further comprising:
   updating the second sampling of the measurements of the source current at a higher sampling rate than the first sampling rate during repeated intervals of time, to generate updated second current measurements;
   determining an updated harmonic compensation factor based on a difference between the first current measurement and the updated second current measurement; and updating a reported current in response to the updated second current measurement and the updated harmonic compensation factor during the repeated intervals of time, the updated reported current representing a magnitude of the source current adjusted by the updated harmonic compensation factor.

9. The method of claim 7, wherein:
the source current is one member of a group of poly-phase currents; and further comprising:
attributing the harmonic compensation factor based on the difference between the first current measurement and the second current measurement, to other currents that are members of the group of poly-phase currents.

10. The method of claim 7, further comprising:
updating the second sampling of the measurements of the source current at a higher sampling rate than the first sampling rate during an updated interval of time, to generate updated second current measurements;
determining an updated harmonic compensation factor based on a difference between the first current measurement and the updated second current measurement; and
updating a reported current in response to the updated second current measurement and the updated harmonic compensation factor during the updated interval of time, the updated reported current representing a magnitude of the source current adjusted by the updated harmonic compensation factor.

11. The method of claim 7, further comprising:
transmitting to a central controller, at least the difference between the first current measurement and the second current measurement by the current sensor;
receiving from the central controller, in response, the harmonic compensation factor based on the difference between the first current measurement and the second current measurement; and
transmitting to the central controller a reported current.

12. The method of claim 7, wherein multiple devices are connected in series to the source current, including a first device of the multiple devices, which is performing more computationally intensive operations at the first sampling rate, than the operations of a second device of the multiple devices, further comprising:
controlling the second device to perform sampling of the source current at the second sampling rate higher than the first sampling rate of the operations of the first device; and
determining a harmonic compensation factor based on the second device performing sampling of the source current at the second sampling rate.

13. The method of claim 7, further comprising:
determining a reported current that is computed as a function of at least (i) the first current measurement by the current sensor, (ii) the difference between the first current measurement and the second current measurement by the current sensor, and (iii) the harmonic compensation factor, the reported current representing a magnitude of the source current adjusted by the harmonic compensation factor.

14. A computer program product, comprising computer executable program code recorded on a computer-readable non-transitory medium, the computer executable program code comprising:
code for sampling, at a first sampling rate, a first current measurement of a source current using a current sensor of the measurement module;
code for incrementing the second sampling rate through a plurality of different second sampling rates, each higher than the first sampling rate, to generate a plurality of second current measurements;
code for selecting one of the plurality of different second sampling rates corresponding to a maximum difference between the first current measurement and the plurality of second current measurements;
code for sampling at the selected one of the plurality of different second sampling rates, measurements of the source current using the current sensor of the measurement module to generate a characterizing second current measurement; and
code for determining a harmonic compensation factor based on a difference between the first current measurement and the characterizing second current measurement; and
code for applying the determined harmonic compensation factor to a third current measurement collected by the current sensor of the measurement module.

15. The computer program product of claim 14, further comprising:
code for updating the second sampling of the measurements of the source current at a higher sampling rate than the first sampling rate during repeated intervals of time, to generate updated second current measurements;
code for determining an updated harmonic compensation factor based on a difference between the first current measurement and the updated second current measurement; and
code for updating a reported current in response to the updated second current measurement and the updated harmonic compensation factor during the repeated intervals of time, the updated reported current representing a magnitude of the source current adjusted by the updated harmonic compensation factor.

16. The computer program product of claim 14, wherein the source current is one member of a group of poly-phase currents; and further comprising:
code for attributing the harmonic compensation factor based on the difference between the first current measurement and the second current measurement, to other currents that are members of the group of poly-phase currents.

17. A controller for minimizing harmonic distortion in measurements, comprising:
at least one processor;
at least one memory including computer program code, wherein the computer program code, when executed by operation of the at least one processor, performs an operation comprising:
controlling a measurement module to use a first sampling frequency to sample a source current to generate a first current measurement during periods of operation when the source current has minimal harmonic distortion;
controlling the measurement module to use a second sampling frequency to sample the source current to temporarily increase a sampling frequency of the source current for an interval of time to generate a second current measurement;
providing a harmonic compensation factor to the measurement module to minimize effects of harmonic distortion in measurements of the source current;
receiving a reported current from the measurement module representing a magnitude of the source current adjusted by a sum of the first current measurement and a difference between the first current measurement and the second current measurement, with the harmonic compensation factor applied to the sum;

comparing a magnitude of the received reported current with magnitudes of previously received reported currents measured at lower sampling rates to determine whether an increase in the magnitude of the received reported current over the magnitudes of previously received reported currents is minimal, indicating an accuracy in the measurement of the source current;

adjusting at least one of the second sampling frequency or the harmonic compensation factor in response to the comparing magnitude of the received reported current with the magnitudes of previously received reported currents; and controlling the measurement module to repeat sampling the source current using at least one of the adjusted second sampling frequency or the adjusted harmonic compensation factor.

18. A method for minimizing harmonic distortion in measurements using a controller, comprising:

controlling a measurement module to use a first sampling frequency to sample a source current to generate a first current measurement during periods of operation when the source current has minimal harmonic distortion;

controlling the measurement module to use a second sampling frequency to sample the source current to temporarily increase a sampling frequency of the source current for an interval of time to generate a second current measurement;

providing a harmonic compensation factor to the measurement module to minimize effects of harmonic distortion in measurements of the source current;

receiving a reported current from the measurement module representing a magnitude of the source current adjusted by a sum of the first current measurement and a difference between the first current measurement and the second current measurement, with the harmonic compensation factor applied to the sum;

comparing a magnitude of the received reported current with magnitudes of previously received reported currents measured at lower sampling rates to determine whether an increase in the magnitude of the received reported current over the magnitudes of previously received reported currents is minimal, indicating an accuracy in the measurement of the source current;

adjusting at least one of the second sampling frequency or the harmonic compensation factor in response to the comparing magnitude of the received reported current with the magnitudes of previously received reported currents; and controlling the measurement module to repeat sampling the source current using at least one of the adjusted second sampling frequency or the adjusted harmonic compensation factor.

19. A computer program product for a controller, comprising computer executable program code recorded on a computer-readable non-transitory medium, the computer executable program code comprising:

code for controlling a measurement module to use a first sampling frequency to sample a source current to generate a first current measurement during periods of operation when the source current has minimal harmonic distortion;

code for controlling the measurement module to use a second sampling frequency to sample the source current to temporarily increase a sampling frequency of the source current for an interval of time to generate a second current measurement;

code for providing a harmonic compensation factor to the measurement module to minimize effects of harmonic distortion in measurements of the source current;

code for receiving a reported current from the measurement module representing a magnitude of the source current adjusted by a sum of the first current measurement and a difference between the first current measurement and the second current measurement, with the harmonic compensation factor applied to the sum;

code for comparing a magnitude of the received reported current with magnitudes of previously received reported currents measured at lower sampling rates to determine whether an increase in the magnitude of the received reported current over the magnitudes of previously received reported currents is minimal, indicating an accuracy in the measurement of the source current;

code for adjusting at least one of the second sampling frequency or the harmonic compensation factor in response to the comparing magnitude of the received reported current with the magnitudes of previously received reported currents; and code for controlling the measurement module to repeat sampling the source current using at least one of the adjusted second sampling frequency or the adjusted harmonic compensation factor.

* * * * *